United States Patent [19]

Mülder

[11] 4,301,423
[45] Nov. 17, 1981

[54] CIRCUIT FOR CONTROLLING THE FREQUENCY OF A PULSE GENERATOR ASSOCIATED WITH A MICROPROCESSOR

[75] Inventor: Arjen J. Mülder, Bingen, Fed. Rep. of Germany

[73] Assignee: NSM Apparatebau GmbH Kommanditgesellschaft, Bingen, Fed. Rep. of Germany

[21] Appl. No.: 70,876

[22] Filed: Aug. 29, 1979

[30] Foreign Application Priority Data

Sep. 7, 1978 [DE] Fed. Rep. of Germany ....... 2838969

[51] Int. Cl.³ ............................................. H03L 7/08
[52] U.S. Cl. ..................................... 331/1 R; 331/8; 331/143; 331/177 R
[58] Field of Search .................. 331/1 R, 1 A, 18, 25, 331/34, 111, 143, 177 R, 179, 21, 8

[56] References Cited

U.S. PATENT DOCUMENTS

| | | | |
|---|---|---|---|
| 3,129,390 | 4/1964 | March et al. | 331/21 X |
| 3,205,452 | 9/1965 | Saudinaitis | 331/34 X |
| 3,708,762 | 1/1973 | Nilsson | 331/177 R X |

*Primary Examiner*—Siegfried H. Grimm
*Attorney, Agent, or Firm*—Max Fogiel

[57] ABSTRACT

A circuit for controlling the frequency of a pulse generator associated with a microprocessor that is connected to power line frequency, uses an RC-stage which is connected ahead of the pulse generator as the frequency-determining element and which has a resistor 19 that is variable by a control signal derived from the microprocessor. The control signal is obtained by comparing the power line frequency and the pulse frequency with one another.

4 Claims, 4 Drawing Figures

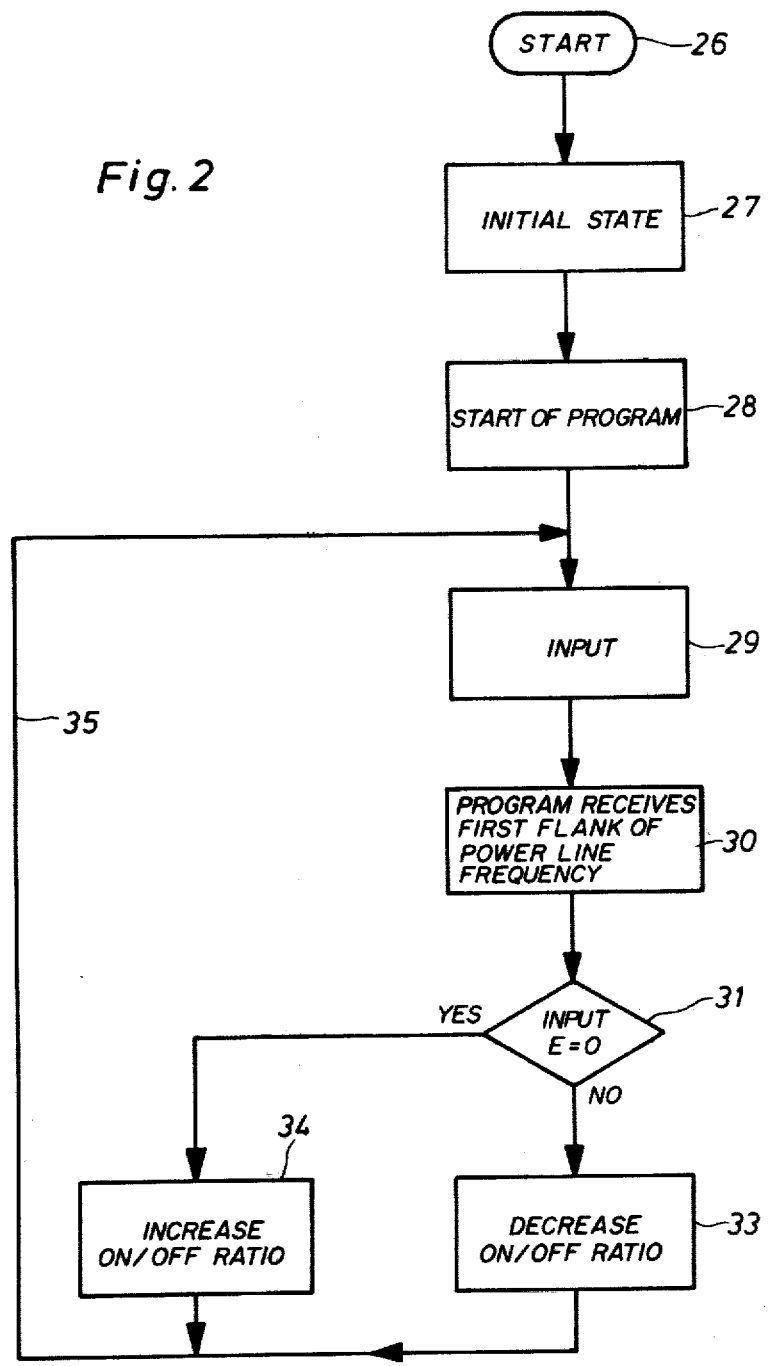

CIRCUIT FOR CONTROLLING THE FREQUENCY OF A PULSE GENERATOR ASSOCIATED WITH A MICROPROCESSOR

BACKGROUND OF THE INVENTION

The invention relates to a circuit for controlling the frequency of a pulse generator associated with a microprocessor, wherein the microprocessor is connected to power line frequency and a frequency-determining element in form of an RC-stage is connected ahead of the pulse generator.

Microprocessors are provided with a pulse generator for determining the timed sequencing of the program. If a program with an exact maintenance of the sequencing is required, then a pulse generator must be used having a quartz crystal as the frequency-determining element. Contrary thereto, in case of a program where the timing sequence is unimportant or at least not critical, a pulse generator can be used having an RC-stage as the frequency determining element which, incidentally, is temperature sensitive. The quartz crystal operates very precisely, but it is relatively expensive. In contrast thereto, the RC-stage operates very imprecisely, but it is very inexpensive. Further a simple replacement of the two aforementioned components can readily be employed to change the timed sequence of the program, which is particularly of disadvantage when the circuit is used in a coin-operated game device wherein the timing sequence must be exactly maintained.

SUMMARY OF THE INVENTION

The purpose of the invention is to provide a circuit of the type mentioned at the beginning which is simple as possible in its construction and at the same time operates with extreme precision, and to exclude manipulations of the same.

This problem is solved in accordance with the invention in that the resistor of the RC-stage is variable via a control signal derived from the microprocessor, and that the control signal is obtained from a comparison between the power line frequency and the pulse frequency.

According to a further aspect of the invention a power source composed of a resistor and a transistor is connected ahead of the resistor of the RC-stage. According to another embodiment of the invention, the digital control signal at the output of the microprocessor is convertible via a conversion circuit into an analog control signal which is supplied to the base of the transistor of the power source.

To obtain as simple as possible a construction of the conversion circuit the same is, according to another embodiment of the invention, composed of a transistor and a resistor connected in series, with the collector output of this transistor being connected via a further resistor with the base of the transistor of the power source that is connected ahead of the resistor of the RC-stage, and the base of the transistor of the power source is connected with the supply voltage via a capacitor.

The circuit according to the invention requires a small number of components, which leads to a low space requirement and to a simplification of the manufacture and thus to low costs. The circuit according to the invention which is based on the concept of synchronizing the frequency of the pulse generator with the power line frequency, makes it possible to obtain a favorable long time frequency constant. The capacitor connected ahead of the power source of the RC-stage serves to maintain the pulse frequency constant. A control pulse produced by the microprocessor charges or discharges the capacitor and thus changes the pulse frequency.

Hereafter, an exemplary embodiment of the invention will be described with reference to the drawings.

BRIEF DESCRIPTION OF THE DRAWINGS

FIG. 2 is the function diagram of the circuit according to FIG. 1.

DESCRIPTION OF THE PREFERRED EMBODIMENTS

Figure 1:
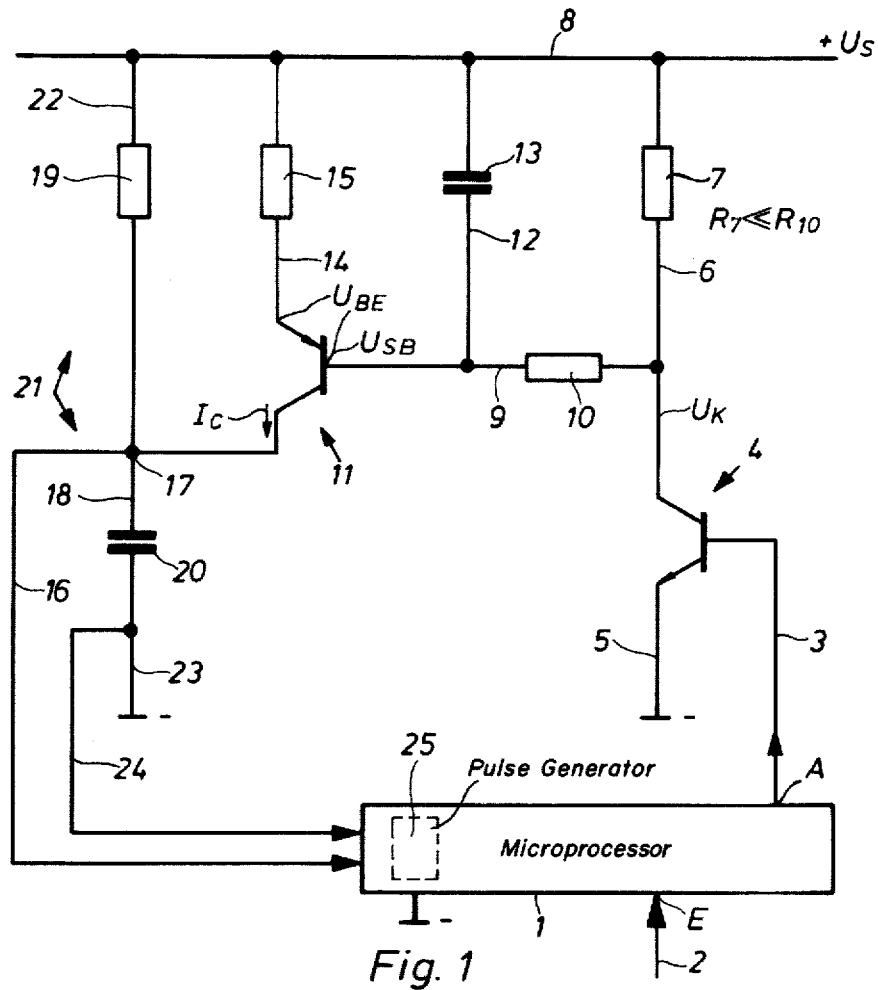
FIG. 1 is a circuit diagram of a circuit according to one embodiment of the invention.

The microprocessor 1 is connected via the conductor 2 to the power line frequency of 50 cycles. An output line 3 extends from the microprocessor 1 to the base of a transistor 4 the emitter of which is connected to mass via the conductor 5 and the collector of which is connected via a line 6 with interposed resistor 7 with the conductor 8 for the supply voltage $U_S$. Between the collector of the transistor 4 and the resistor 7 a conductor 9 with an interposed resistor 10 branches off the conductor 6 and leads to the base of a transistor 11. A further conductor 12 branches off the conductor 9 between the resistor 10 and the transistor 11; a capacitor 13 is interposed in the line 12 and the latter is connected with the line 8. The emitter of the transistor 11 is also connected with the conductor 8 via a conductor 14 with interposed resistor 15. The collector of this transistor 11 is connected via an input conductor 16 to the microprocessor 1. The input conductor 16 is connected via a junction point 17 with the conductor 18 between a resistor 19 and a capacitor 20, which together form the RC-stage 21. The resistor 19 is connected via the conductor 22 to the conductor 8 and the capacitor 20 is connected on the one hand to mass via the conductor 23 and on the other hand via the conductor 24 to the microprocessor 1 in which the pulse generator 25 is integrated.

To explain the operation of the circuit according to the exemplary embodiment of the invention, the functional flow diagram of the same will hereafter be described. After connecting the circuit to the supply voltage $U_S$ in the block 26 the pulse generator 25 begins to operate with a frequency which is lower than the intended frequency. In the block 27 the capacitor 13 is still discharged. Accordingly, the transistor 11 is blocked so that no current can flow through this transistor 11. The frequency is determined only by the RC-stage 21.

Figure 3:
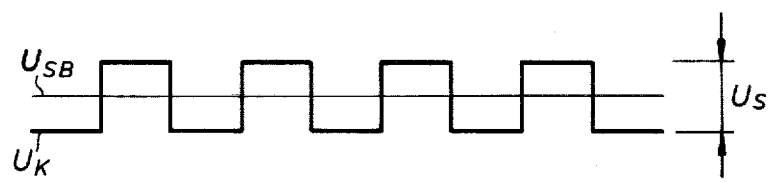
FIG. 3 illustrates the different voltages of the circuit according to FIG. 1.

A program supplied to the microprocessor 1 produces at the output A thereof pulses in the block 28. The on/off relationship of the pulses determines the frequency of the pulse generator 25. The initial ratio is approximately 50 percent on to 50 percent off, because in this case the voltage $U_B$ at the base of the transistor 11 is approximately half the magnitude of the supply voltage $U_S$, because the resistor 7 is much smaller than the resistor 10 (compare FIG. 3). The collector voltage $U_K$ of the transistor 4 is thus to 50 percent equal to $U_S$ and to 50 percent equal to zero.

Figure 4:
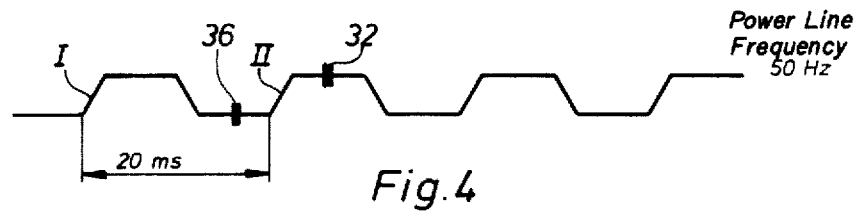
FIG. 4 illustrates the power line frequency.

The capacitor 13 is charged via the resistor 10 and the transistor 4 when the transistor 4 conducts current and is discharged via the resistors 7 and 10 when the transistor 4 does not conduct current. The collector current $I_C$ of the transistor 11 is obtained from the following equation:

$$I_C = (U_{SB} - U_{BE})/R_{15}$$

wherein $U_{SB}$ is the potential between the base of the transistor 11 and the voltage $U_S$, $U_{BE}$ is the potential between the base and the emitter of the transistor 11 and $R_{15}$ is the size of the resistor 15. When the transistor 11 carries the collector current $I_C$, then the frequency of the pulse generator 25 increases. The pulse frequency thus is a function of the potential $U_{SB}$ of the transistor 11. The exact dependency of the pulse frequency from the potential $U_{SB}$ of the transistor 11 depends upon the type of pulse generator 25 which is used. In the block 29 the input E of the power line frequency is supervised by the program of the microprocessor 1. At the input E, the power line frequency of 50 cycles is present (compare FIG. 4). It is exactly 20 MSEC from the first flank I to the second flank II of the power line frequency. In the block 30 the program of the microprocessor 1 receives the first flank I of the power line frequency. According to block 31 the program expects the second flank II of the power line frequency to arrive after 20 MSEC. Since the program passage speed is exactly proportional to the pulse frequency, the interrogation of the input E occurs too soon if the pulse frequency is too high and it occurs too late if the pulse frequency is too low. Accordingly, if the interrogation is at the location 36 of FIG. 4, then the pulse frequency is too high. On the other hand, if the interrogation is at the location 32 of FIG. 4, then the pulse frequency is too low. If the result in block 31 is "no" then the block 33 follows with the function "decrease the on/off ratio of the impulses at the output A of microprocessor 1". In this case the capacitor 13 is charged to a greater extent. The potential $U_{SB}$ of the transistor 11 is relatively low and because of this the transistor 4 draws more current, so that the pulse frequency increases. If, on the other hand, the result in block 31 is "yes" this is followed by the block 34 with the function "increase the on/off ratio of the pulses at the output A of the microprocessor 1". In this case, the capacitor 13 is charged to a lesser degree. The potential $U_{SB}$ of the transistor 11 is relatively high and therefore the transistor 4 draws less current, so that the pulse frequency becomes slower. When the new frequency has been set, i.e. has been increased or decreased, then the microprocessor determines via the feedback loop 35 whether the 20 MSEC of the 50 cycle power line frequency has been reached. If not, the pulse frequency is correspondingly changed. Since the second flank II of the power line frequency itself cannot be sensed by the microprocessor, only a determination is made whether the interrogation is too early or too late. Thus, the pulse frequency oscillates about its intended value. In order to keep the oscillations of the pulse frequency small, the increase or decrease of the same by the program of the microprocessor in the blocks 33, 34 must be kept as small as possible.

I claim:

1. In a circuit for controlling the operation of a microprocessor which receives electric energy from an AC source, a combination comprising a pulse generator operatively connected to the microprocessor; and means for controlling the operating frequency of the pulse generator, including an RC-stage operatively connected to the pulse generator and including a resistor having a resistance value which is variable by a control signal issuing from the microprocessor and which results from a comparison of the pulse frequency with the AC-source frequency.

2. A combination as defined in claim 1; and further comprising a power supply circuit connected to said resistor and including a resistor and a transistor in circuit therewith.

3. A combination as defined in claim 2, said microprocessor having an output at which said control signal appears as a digital signal; and further comprising a converter circuit for converting the digital signal into an analog signal and supplying the analog signal to a base of said transistor.

4. A combination as defined in claim 3, said converter circuit including one resistor, a transistor connected in series therewith and having a collector output, another resistor, and means connecting said collector output via said other resistor to the base of the first-mentioned transistor; and means electrically connecting the base of said first-mentioned transistor via a capacitor with the supply voltage for the control circuit.

* * * * *